United States Patent [19]

Ludwig

[11] Patent Number: 5,594,355

[45] Date of Patent: Jan. 14, 1997

[54] ELECTRICAL CONTACTOR APPARATUS FOR TESTING INTEGRATED CIRCUIT DEVICES

[75] Inventor: Kevin E. Ludwig, El Cajon, Calif.

[73] Assignee: Delta Design, Inc., San Diego, Calif.

[21] Appl. No.: 277,236

[22] Filed: Jul. 19, 1994

[51] Int. Cl.[6] .................................................. H01R 9/09
[52] U.S. Cl. ............................................... 324/755; 439/66
[58] Field of Search ..................................... 324/754, 755, 324/158.1, 72.5; 439/66, 69, 71, 591

[56] References Cited

U.S. PATENT DOCUMENTS

| | | | |
|---|---|---|---|
| 3,215,968 | 11/1965 | Herrmann | 339/17 |
| 4,008,300 | 2/1977 | Ponn | 264/104 |
| 4,008,519 | 2/1977 | Gilissen et al. | 29/625 |
| 4,161,346 | 7/1979 | Cherian et al. | 339/17 |
| 4,176,895 | 12/1979 | Aldridge | 339/17 |
| 4,199,209 | 4/1980 | Cherian et al. | 339/59 |
| 4,202,588 | 5/1980 | Dalamangas et al. | 339/59 |
| 4,209,799 | 6/1980 | Schierz et al. | 357/81 |
| 4,278,990 | 7/1981 | Fichot | 357/81 |
| 4,344,662 | 8/1982 | Dalamangas et al. | 339/59 |
| 4,445,735 | 5/1984 | Bonnefoy | 339/17 |
| 4,941,832 | 7/1990 | Korsunsky et al. | 439/71 |
| 4,962,356 | 10/1990 | Eberlein et al. | 324/755 |
| 5,069,629 | 12/1991 | Johnson | 439/71 |
| 5,207,584 | 5/1993 | Johnson | 439/66 |
| 5,245,277 | 9/1993 | Nguyen | 324/755 |
| 5,336,094 | 8/1994 | Johnson | 439/62 |

FOREIGN PATENT DOCUMENTS

| | | |
|---|---|---|
| 856 | 2/1979 | European Pat. Off. . |
| 2236272 | 1/1975 | France . |
| 2306547 | 10/1976 | France . |
| 2452178 | 10/1980 | France . |
| 881571 | 11/1961 | United Kingdom . |

OTHER PUBLICATIONS

IBM Technical Disclosure, Durand, vol. 21, No. 3, pp. 1064–1065, Aug. 19, 1978.

*Primary Examiner*—Vinh P. Nguyen
*Attorney, Agent, or Firm*—Brown, Martin, Haller & McClain

[57] ABSTRACT

A contactor apparatus for electrically interconnecting a lead of an electrical device to a conductive area on a board. The contactor apparatus includes a housing having a slot. It also includes a probe disposed within the slot, the probe having a fulcrum for engaging the conductive area on the board and an arm for engaging the lead of the electrical device. The contactor apparatus further includes an elastomeric element disposed transverse the slot and engaging the probe, wherein as the lead of the electrical device engages the arm, the probe pivots within the slot about said fulcrum, the fulcrum rocking on the conductive area of the board. The contactor apparatus may also include a manual nest for holding the electrical device. The manual nest has a handler for securing the electrical device within the housing, the handler having an open window for accessing the lead of the electrical device when the manual nest is inserted into the housing. The housing may include several guide posts extending upwardly from the housing for guiding the electrical device into housing as the electrical device is inserted into the housing, whereby the lead of the electrical device is aligned with the probe.

21 Claims, 3 Drawing Sheets

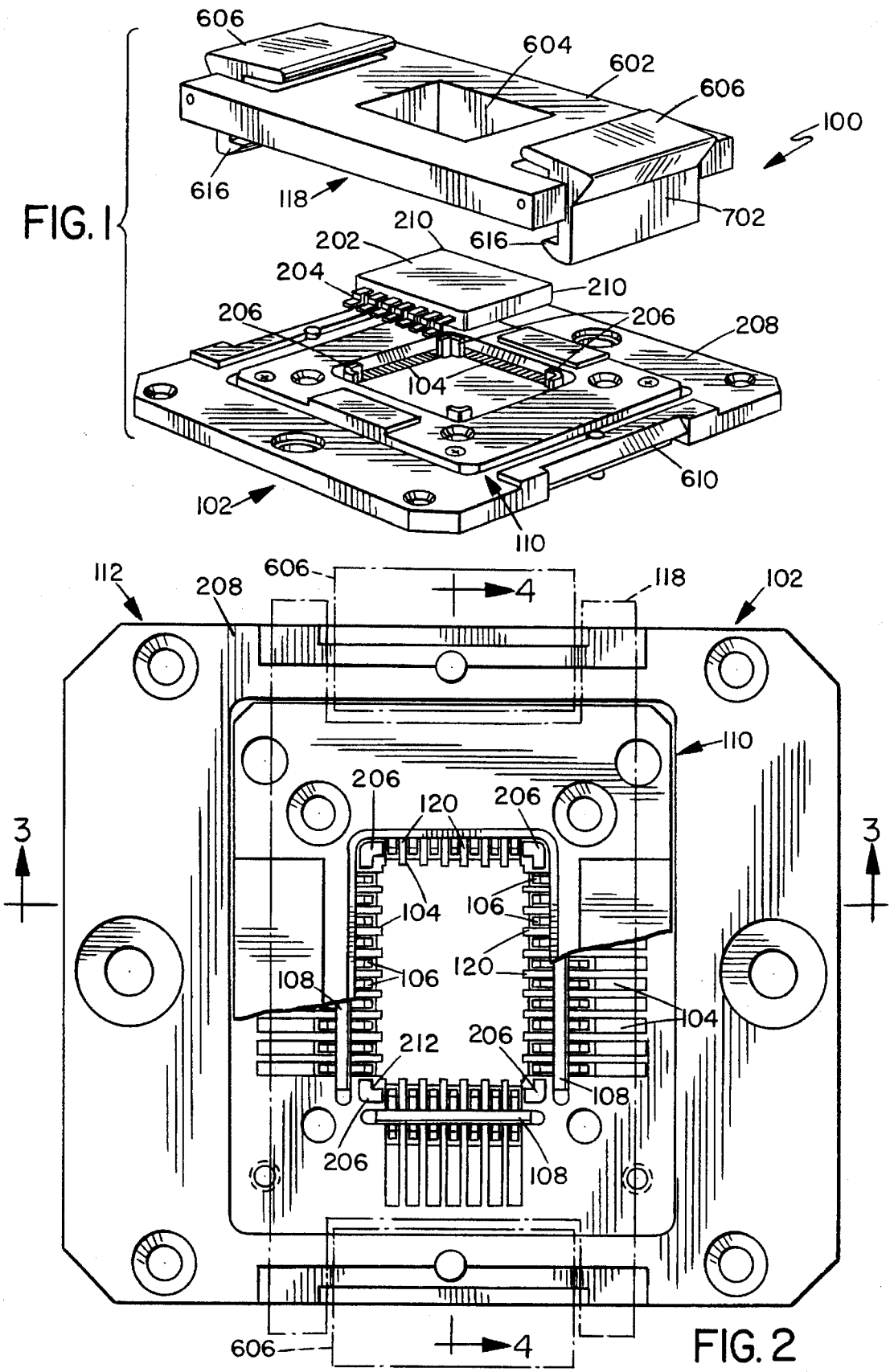

ELECTRICAL CONTACTOR APPARATUS FOR TESTING INTEGRATED CIRCUIT DEVICES

BACKGROUND OF THE INVENTION

1. Field of the Invention

The present invention relates to a short probe electrical contactor apparatus. More particularly, the present invention relates to an electrical interconnect system for efficient and effective automated or manual testing of integrated circuit devices.

2. Description of Related Art

Many different apparatus exist for establishing connections between two electrical conductors. With the widespread use of integrated circuit ("IC") devices in today's technology, many manufacturers have developed various apparatus to effectuate connections between IC devices and, for example, motherboards and load boards. Such boards have conductive paths that permit interconnection of multiple IC devices, as well as interconnection of IC devices to other types of electrical devices, such as capacitors, resistors, transformers, etc.

With the advent of IC devices, it was necessary to test such devices to determine whether they perform as expected before injecting them into the market for sale and/or use. As a result, an industry arose to facilitate and optimize IC device testing. This industry developed various apparatus that establish interconnections between an IC device and a load board, in order to test the device.

Conventional IC device testing apparatus incorporated relatively long conductive "probes" that establish the connection between the device and the load board. Longer probes, however, create undesirable electrical characteristics, such as increased resistance. Accordingly, in order to optimize the connection between the IC device and the load board, it is important to minimize the distance that current must travel through the probe.

Testing apparatus manufacturers have developed short probe "contactor socket" that reduce probe length and thus improve the interconnection between the IC device and the load board. Such contactor sockets include numerous z- or s-shaped probes seated in slots in a housing. At least two elastomer (or rigid) bands are supplied that run along the slots, securing the probes within the slots and allowing the probes to move in response to engagement with an IC device.

Conventional short probe contactor sockets, however, have several deficiencies. First, they promote a "wiping action" of the probes along the traces on the load board, thereby damaging those traces with each successive testing iteration. Second, they require at least two elastomer bands to secure the probes within the slot. Third, they require removal of all of the probes to allow replacement of the bands when they wear-out. And because the bands wear-out much more quickly than do the probes and the probes are quite difficult to remove, replacement of the bands is time-consuming and costly. Fourth, conventional short probe contactor sockets, due to their design, provide only limited upward force against the leads of the IC device, resulting in poor or ineffective connections in some instances.

An additional limitation in conventional short probe contactor sockets involves alignment of the IC device within the contactor. Conventional contactor sockets provide means (usually posts) to align the IC device, such posts being molded into the cover. Location of the posts on the cover, however, causes two sources of error in obtaining proper alignment of the IC device within the contactor socket. The first source of error results from the tolerances between the posts and the probes, inevitably leading to some misalignment between the leads of the IC device and the probes. The second source of error stems from the posts being located on the cover, which must be attached and aligned to the housing. Because the posts are on the cover, any misalignment of the cover with respect to the housing will lead to further misalignment of the IC device leads with respect to the probes.

Many contactor sockets can be used manually (i.e., hand testing) or in conjunction with a machine (i.e., automated testing). In automated testing, a "mechanical nest" picks-up the IC device by means of a vacuum and delivers the IC device into the contactor socket. In hand testing, by contrast, the IC device is manually inserted into the contactor socket, and a "manual nest" is placed inserted into the contactor socket, in the process pressing down the IC device so that it makes full contact with the probes in the contactor socket.

In conventional contactor sockets, however, the manual nest is semi-permanently affixed to the socket by means of a hinge and a latch, making removal of the manual nest time-consuming. When a user wants to switch from manual to automated testing or vice versa, he or she must detach or attach the hinge of the manual nest from the socket. This requires removal or insertion of screws and bolts that maintain the hinge on the socket. Such a process is undesirable, resulting in additional costs and time for users.

Therefore, a need exists for an electrical interconnect system having short probes and that prevents wiping action across the load board, obviates removal of the probes when replacing the bands, provides an upward force by the probes against the IC leads, achieves optimal alignment of the IC device within the socket, and has a manual nest that can be quickly and easily attached and detached from the contactor socket.

SUMMARY OF THE INVENTION

Accordingly, the present invention is directed to an electrical interconnect system, and specifically a short probe contactor apparatus, that substantially obviates one or more of the problems due to limitations and disadvantages of the related art.

Additional features and advantages of the invention will be set forth in the description that follows, and in part will be apparent from the description, or may be learned by practice of the invention. The objectives and other advantages of the invention will be realized and attained by the apparatus particularly pointed out in the written description and claims of this application, as well as the appended drawings.

To achieve these and other advantages, and in accordance with the purpose of the invention as embodied and broadly described herein, the invention is a contactor socket for electrically interconnecting a lead of an electrical device to a conductive area on a board. The contactor socket comprises a housing having a slot. It also comprises a probe disposed within the slot, the probe having a fulcrum for engaging the conductive area on the board and an arm for engaging the lead of the electrical device. The contactor socket further comprises an elastomeric element disposed transverse the slot and engaging the probe. In the contactor socket, as the lead of the electrical device engages the arm, the probe pivots within the slot about the fulcrum, which rocks on the conductive area of the board.

In another aspect, the present invention is a housing for a contactor test socket. The housing has sides, and the contactor test socket is used to electrically interconnect leads of an IC device to corresponding conductive areas on a load board. The housing comprises slots in at least two of the sides for seating corresponding short contact probes. The housing also comprises guide posts extending upwardly from the housing for guiding the IC device into the contactor test socket as the IC is inserted into the contactor test socket, whereby the IC leads are aligned with the short contact probes.

In yet another aspect, the present invention is a manual nest for holding an electrical device, the manual nest engaging a contactor socket. The manual nest comprises a handler for securing the electrical device within the contactor socket, the handler having an open window for accessing leads of the electrical device when the manual nest engages the contactor socket.

It is to be understood that both the foregoing general description and the following detailed description are exemplary and explanatory only and are not restrictive of the invention, as claimed.

The accompanying drawings are included to provide a further understanding of the invention and are incorporated in and constitute a part of this specification, to illustrate the embodiments of the invention, and, together with the description, to explain the principles of the invention.

BRIEF DESCRIPTION OF THE DRAWINGS

FIG. 1 is a perspective view of the separated components of the device;

FIG. 2 is an enlarged plan view of the housing and cover plate assembly, with a portion of the cover plate cut away;

DETAILED DESCRIPTION OF THE PREFERRED EMBODIMENT

Figure 3:
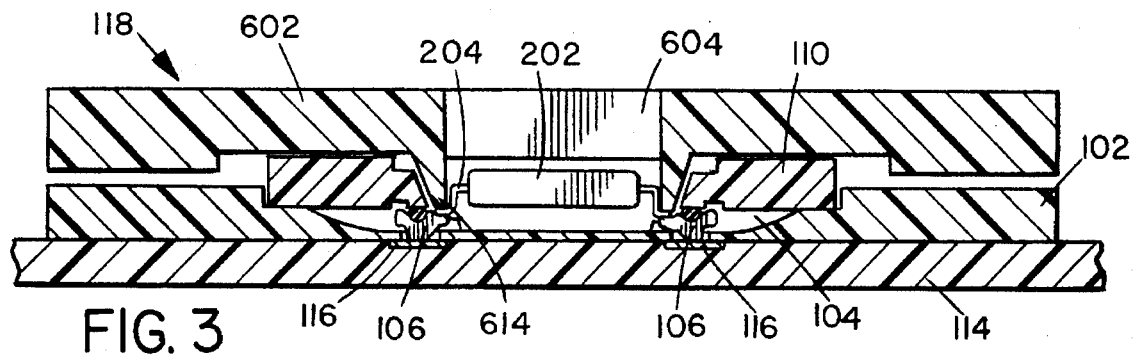
FIG. 3 is a sectional view taken on line 3—3 of FIG. 2.

Reference will now be made in detail to the present preferred embodiment of the invention, an example of which is illustrated in the accompanying drawings. Wherever possible, the same reference numbers will be used throughout the drawings to refer to the same or like parts.

In accordance with the present invention, a short probe electrical contactor apparatus is provided for testing electrical devices. The contactor apparatus can be used for either automated or manual testing of such devices. In one application, the apparatus is used to test integrated circuit ("IC") devices by interconnecting them to a load board, which in turn interfaces with a testing mechanism. Based on predetermined requirements, the testing mechanism runs the IC device being tested through a series of tests to determine whether the IC device is operating properly. The remainder of this description will refer solely to IC devices, but as those skilled in the art will appreciate, the present invention can be used to test any number of various electrical devices, such as digital, analog, RF, and memory devices.

An exemplary embodiment of the contactor apparatus of the present invention is shown in FIG. 1 and is designated generally by reference numeral 100. The contactor apparatus includes a housing 102, which has a number of slots 104 formed in it. A probe 106 is disposed within each of the slots 104, and a band (preferably elastomeric) 108 is disposed transversely across the slots 104 and over the probes 106. A cover plate 110 secures the probes 106 and the elastomer band 108 in the housing 102. Together, the housing 102, the probes 106, and the cover plate 110 constitute a contactor socket 112 in accordance with the present invention. The housing 102, in turn, is coupled to a load board 114, which has a number of conductive traces 116 for interconnecting the probes 106 to a testing mechanism (not shown).

The contactor socket 112 can be used either for automated testing or manual testing. In the former, a mechanical nest (not shown) is used to deliver IC devices to the contactor socket 112. The mechanical nest holds the ICs by means of a vacuum. In manual testing, a manual nest 118 is used in delivering the ICs. First, a user inserts the IC into the contactor socket 112, aligning the IC within the socket. The manual nest 118 is then inserted into the contactor socket 112 on top of the IC, pressing down the IC until it makes full contact with the probes 106 in the contactor socket 112. The manual nest 118 will be described in detail below.

Referring now to FIG. 2, the housing 102 is preferably a one-piece unit constructed from a composite material. It is also possible that various elements of the housing 102 could be separate parts, but this hampers proper alignment of the leads 204 of an IC device 202 to the probes 106 within the housing 102. As embodied herein, therefore, the entirety of the housing 102 is a single molded part, preferably formed from Torlon®5030, a material publicly available from the Amoco Corporation.

Further, in accordance with the present invention, in the preferred embodiment of the housing 102, several (preferably four) guide posts 206 are provided for aligning the four corners 210 of the IC device 202 within the contactor socket 112. The four guide posts 206 are preferably an-integral part of the one-piece housing 102. The guide posts 206 extend upwardly from the top surface 208 of the housing 102 in order to guide the IC device 202 into the contactor socket 112 as the IC 202 is inserted into the socket 112.

Figure 7:
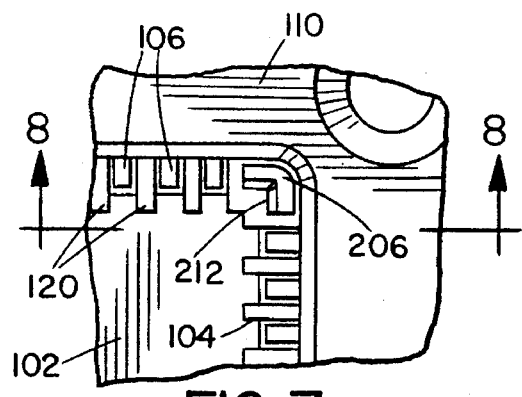
FIG. 7 is an enlargement of a portion of FIG. 2, showing one corner guide post.
Figure 8:
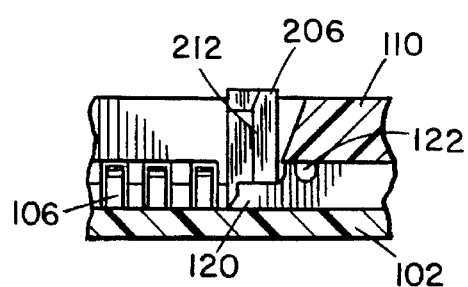
FIG. 8 is a sectional view taken on line 8—8 of FIG. 7.
Figure 9:
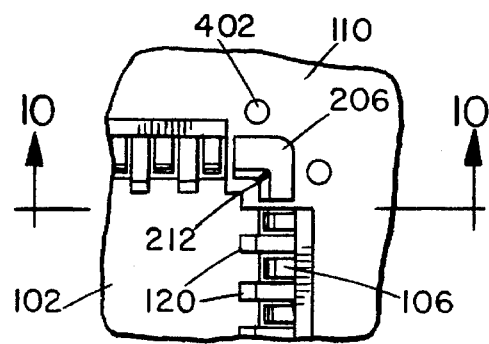
FIG. 9 is a view similar to FIG. 7, but with the guide post mounted on the cover plate.
Figure 10:
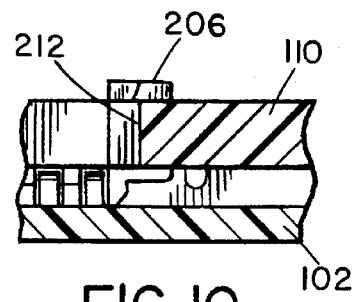
FIG. 10 is a sectional view taken on line 10—10 of FIG. 9.

As shown in FIGS. 7 and 8, each guide post 206 has an inside surface 212 for engaging the IC device 202. The inside surface 212 defines an interior angle of approximately 90 degrees. Alternatively, as shown in FIGS. 9 and 10, the guide posts 206 can be formed on the cover plate 110 rather than the housing 102.

Figure 4:
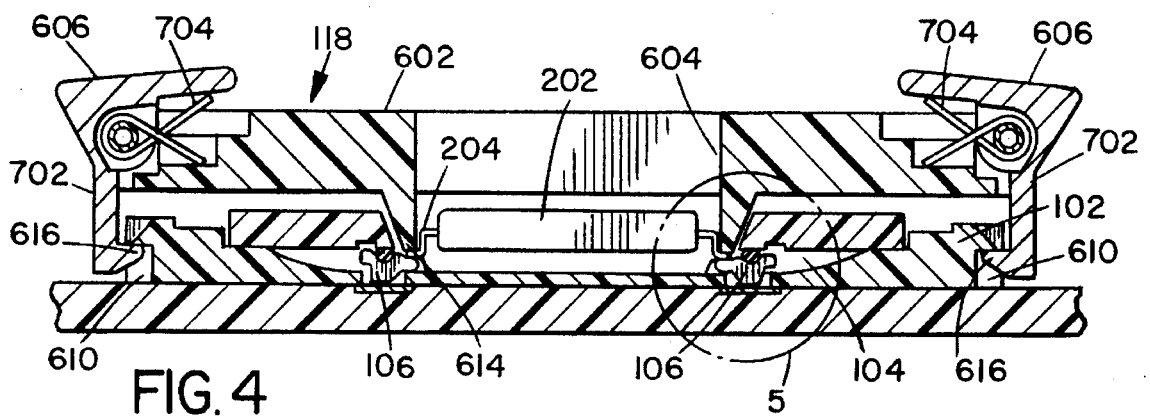
FIG. 4 is a sectional view taken on line 4—4 of FIG. 2.

When the guide posts 206 are integral to the housing 102, as shown in FIG. 2, misalignment of the IC device 202 within the contactor socket 112 will be minimized. As described above, location of the guide posts 206 on the housing 102 minimizes the sources of error that can impede proper alignment of the IC device 202 within the contactor socket 112. One source of error results from tolerances between the guide posts 206 and the probes 106, inevitably leading to some misalignment between the leads 204 of the IC device 202 and the probes 106, no matter where the guide posts 206 are located. Thus, this source of error comes into play even when the guide posts 206 are an integral part of the housing 102. But when the guide posts 206 are located on the cover plate 110, as shown in FIG. 4, an additional source of error arises. As illustrated in FIG. 9, when attached to the housing 102, the cover plate 110 may require means 402, such as pins or posts, for aligning the cover plate 110 on the housing 102. Because the leads 204 of the IC device 202 and the probes 106 are small and closely spaced, any small misalignment may result in ineffective connection of the leads 204 and the probes 106.

The housing 102 is preferably a rectangular shape having four sides. Depending on the dimensions of the IC device 202 being tested, several or all of the sides may include the slots 104 along the side. For example, if the IC device 202 has leads 204 along all of its four sides, the housing 102 will have slots 104 along all four sides, corresponding to the leads 204 of the. IC device 202. If, on the other hand, the IC device 202 has leads on only two sides, the housing need only have slots 104 on two corresponding sides. Thus, the slots 104 could be organized in multiple arrays. Those skilled in the art will recognize that IC devices have many different configurations and sizes, and the housing 102 of the present invention can be customized to fit any such IC device. Moreover, the housing 102 of the present invention can be made such that it will generically fit: several or many different IC devices that have similar configurations, but may have different numbers of leads, or leads along only two sides rather than four. Of course, depending on the IC device being tested, the testing program must be altered to test the appropriate device.

Figure 5:
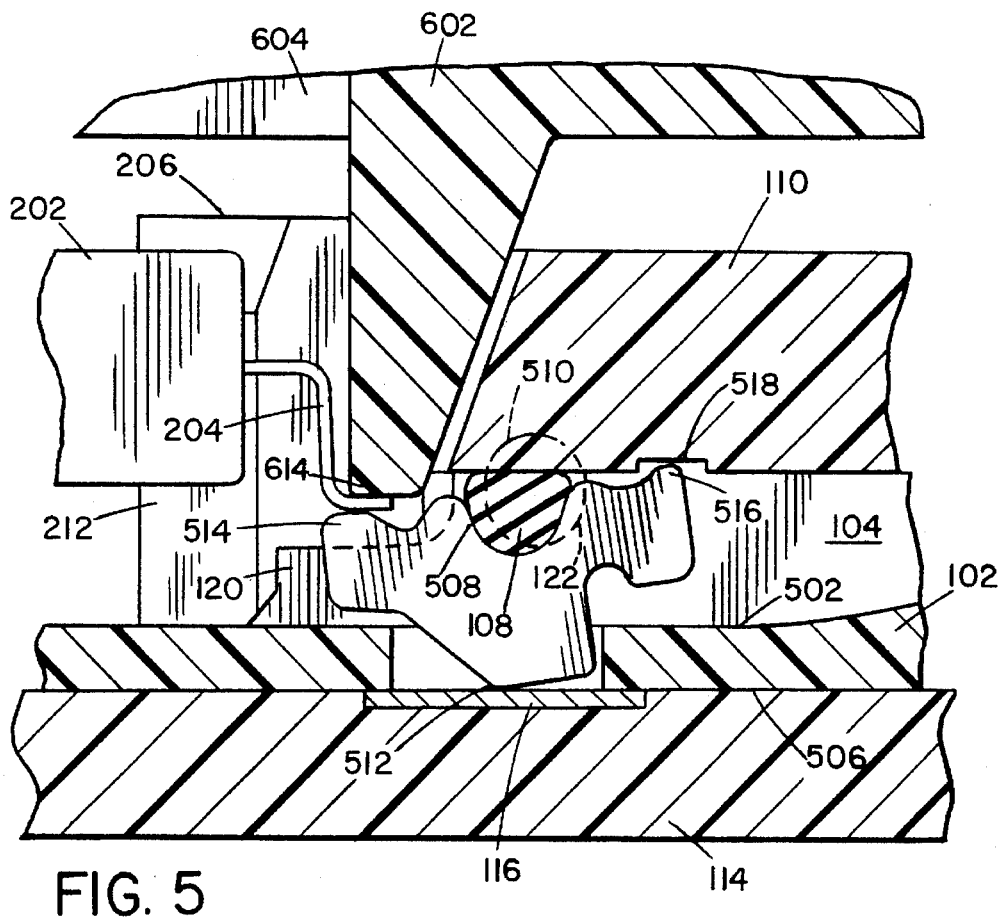
FIG. 5 is an enlargement of the circled area of FIG. 4, showing an IC clamped in the socket.

FIG. 5 shows a single probe 106 seated in a single slot 104, illustrating the preferred embodiment of the probe 106 and slot 104. As can be seen, the slot 104 extends fully through the vertical dimension of the housing 102 from an open lower area 502 to the upper surface 208. A lower surface 506 of the housing 102 engages the load board 114, which has the conductive area or trace 116 that contacts the probe 106. The elastomer band 108 is seated in a groove 508 formed in the top of the probe 106. A second groove 510 may be formed in the cover plate 110, although preferably the cover plate 110 has no such groove 510. If the cover plate 110 does not include a groove 510, i.e., the cover plate 110 is flat, when in place, it will press down on and slightly deform the elastomer band 108. The cover plate 110 is secured to the upper surface 208 of the housing 102, and if provided, the second groove 510 acting to hold the elastomer band 108 in the proper position within the slot 104. When secured to the housing 102, the cover plate 110 holds the probe 106 and the elastomer band 108 within the slot 104. As embodied herein, the cover plate 110, like the housing 102, is machined or molded from a composite material, preferably Torlon®5030.

Referring back to FIGS. 2 and 5, the housing 102 has a plurality of walls (or combs) 120 separating the slots 104 from one another. The probes 106 are inserted into the slots 104 and held upright by the combs 120, which also provide an insulating barrier between each of the probes 106. On the top of each of the combs 120 is a groove 122 that seats the elastomer band 108 so that it can pass through each of the combs 120. The grooves 122 in the combs 120 are substantially aligned with the grooves 508 in the probes 106. Together, the grooves 508 in the probes 106 and the grooves in the top of the combs 120 comprise a channel in which the elastomer band 108 is seated.

Due to the shape of the probes 106 and the configuration of the slot 104, elastomer band 108, and grooves in the combs 120, the probe 106 "rocks" or "pivots" within the slot 104 when engaged by the lead 204 of the IC device 202. On its bottom, the probe 106 has a fulcrum 512 that makes contact with the trace 116 of the load board 114. The probe 106 also has an arm 514 extending toward the IC lead 204. The back of the probe 106 may include a stopper 516. As illustrated in FIG. 5, as the IC lead 204 engages the arm 514, the probe 106 undergoes a rocking or pivoting motion as the fulcrum 512 rocks or pivots on the trace 116 of the load board 114. During this rocking or pivoting motion, the stopper 516 (if provided.) moves into a channel 518 formed in the cover plate 110. The channel 518 permits adequate movement of the-probe 106 within the slot 104. Those skilled in the art will appreciate that the illustrated probe 106 is but one specific shape or configuration that works well with the principles of the present invention. Therefore, variations on the probe configuration illustrated will also work in accordance with the present invention.

Due to the rocking motion of the probe 106, no appreciable "wiping action" occurs along the conductive area or trace 116. That is, the fulcrum 512 does not slide or rotate but rather rocks on the conductive trace 408, preventing a side-to-side and/or rotational scrub along trace. The lack of wiping action on the trace 116 reduces wear to the trace and increases the life of the probe 106. In contrast, some wiping action will occur at the connection between the IC lead 204 and the arm 514. This is desirable, because the lead 204 of the IC device 202 being tested may have accumulated particles that will undermine the quality of the electrical connection between the lead 204 and the probe 106. The wiping action of the arm 514 across the IC lead 204 will remove much of this particulate build-up, if any exists on the lead. As for the trace 116 on the load board 114, by contrast, particulate contamination is less likely to occur than on the IC leads 204, because the load board 114, if attached to the housing 102, does not come into contact with substantial amounts of contaminants. Furthermore, the housing 102 can be easily and quickly detached from the load board 114, making the traces 116 on the load board 114 simple to clean.

The elastomer band 108 performs two important functions in the present invention. First, when the probe 106 is in a receiving position, i.e., when no IC lead 204 is engaging the arm 514, the elastomer band 108 is expanded, urging the probe 106 downward, such that the fulcrum 512 may sit squarely on the trace 116 and the arm 514 is raised upward. In other words, referring to FIG. 6, the probe is forced by the elastomer band 108 in a clockwise direction into the receiving position. Second, when the probe 106 is in a contact position, i.e., when the IC lead is fully engaging the arm 514, the elastomer band is contracted, absorbing the force exerted by the edge of the groove 508 in the probe 106 as the probe 106 moves from the receiving position to the contact position. With reference to FIG. 5, in reaching the contact position from the receiving position, the IC lead 204 engages the probe 106 and forces it to rotate in a counter-clockwise direction, with the fulcrum 512 rocking on the trace 116, the elastomer band 108 contracting, and the stopper 516 moving upward into the channel 518. Going in the opposite direction, i.e., as the IC lead 204 is removed from the apparatus, the elastomer band 108 urges the edge of the groove 508, and thus the probe 106, in a clockwise direction with the fulcrum again rocking on the trace 116, the elastomer 108 band expanding, and the arm 514 moving upward back to the receiving position.

The first function performed by the elastomer band 108 results in increased conductivity from the IC lead 204 through the probe 106 to the trace 116. Due to the rocking or pivoting action of the probe 106, the arm 514 is forced upward against the IC lead 204 when the probe 106 is in the contact position. As a result, the arm 514 maintains a good connection with the IC lead 204. Other short probe contactor apparatus, in contrast, use two or more elastomer bands, and as the IC lead engages the probe, the elastomer bands permit the probe to be forced outward, causing it to "slide" away from the lead and across the trace on the load board. In this way, wiping action occurs along the trace, and the arm of the probe causes little upward force against the IC lead but rather slides outward from the IC lead, in some instances causing a poor electrical connection between the IC lead and the probe.

The probe 106 is formed from an electrically conductive metallic material. Preferably, this material comprises a beryllium-nickel core, with a gold and nickel plating over the core, the nickel being applied first and the gold on top of the nickel. This material provides a generous electrical connection. Alternatively, the core of the probe 106 can be beryllium-copper, with a gold and nickel plating. Due to the configuration of the housing 102, the slot 104, and the probe 106, the probe 106 has a short lead length, thereby increasing conductivity. As embodied herein, the probe 106 has a lead length of 0.100 inches or less, and vertical movement of the arm 514 when engaged by the IC device 202 is 0.010 to 0.012 inches.

The vertical movement of the arms 514 of the probes 106 is known as "deflection." Therefore, as embodied herein, the probes 106 have a range of deflection of 0.002 inches. This is important because the IC leads 204 are not always even on the bottom surface due to manufacturing tolerances, and without having an adequate range-of deflection, all of the leads 204 in a single IC device 202 would not necessarily make effective contact with the probes 106. Thus, if the probes 106 are made coplanar, with an adequate range of deflection (here, 0.002 inches), any discrepancies in the location of the bottom surfaces of the IC leads 204 will not impair the electrical connection.

The elastomer band 108 can be formed from a variety of materials. Preferably, however, the elastomer band 108 is an extruded or molded silicon rubber compound having a hardness in the range of 30 Shore A to 90 Shore A, with the preferred hardness being 70 Shore A.

Referring again to FIG. 5 elastomer band 108 can be replaced without having to remove the probes 106 from the housing 102. In assembling the contactor socket 112, the probes 106 are seated within the slots 104, and the elastomer band 108 is seated transverse the slots 104 and probes 106, specifically in the grooves 508 on the top of the probes 106 and in the grooves on the top of the combs 120. The cover plate 110 is then secured to the housing 102 on top of the elastomer band 108 and the probes 106. Due to its composition, the elastomer band 108 will deteriorate and must be replaced well before the metallic probes 106. In fact, the elastomer band 108 may require replacing several times before the probes 106 must be replaced. When replacement of the elastomer band 108 is required, the cover plate 110 is removed from the housing 102, thereby exposing the elastomer band 108 and the probes 106. Because the elastomer band 108 is seated in the grooves 508 on the top of the probes 106, the elastomer band 108 can simply be lifted out of the housing and a new band inserted into the grooves 508 and the grooves in the top of the combs 120. This obviates the need to first remove the probes 106 before gaining access to the elastomer band 108, a time-consuming and difficult exercise.

With reference to FIGS. 1 and 4, in testing IC devices manually, a manual nest 118 is used. First, the user seats the IC device 202 within the contactor socket 112, aligning the IC device 202 with the guide posts 206. The user then inserts and fastens the manual nest 118 into the contactor socket 112 on top of the IC 202, in the process pressing down the IC 202 so that it makes full contact with each of the probes 106. The guide posts 206 on the contactor socket 112 are used to maintain the IC 202 and handler 602 in proper alignment as they are inserted into the contactor socket 112. As embodied herein, either the manual nest 118 or a mechanical nest (not shown) can be used with the contactor socket 112 of the present invention, depending on the user's needs.

The handler 602 includes an open window 604 through which the user can access the leads of the IC device being tested. It is helpful in manually testing IC devices to use a multimeter or similar device to monitor the leads of the IC for current, voltage, etc. To do this, the user must have access to the leads of the IC device. With the open window 604 of the handler 602, the user can insert the multimeter probe into the contactor socket 112 and touch the multimeter probe to the leads of the IC device being tested. As embodied herein, the open window 604 has dimensions such that each and every IC lead can be accessed.

Figure 6:
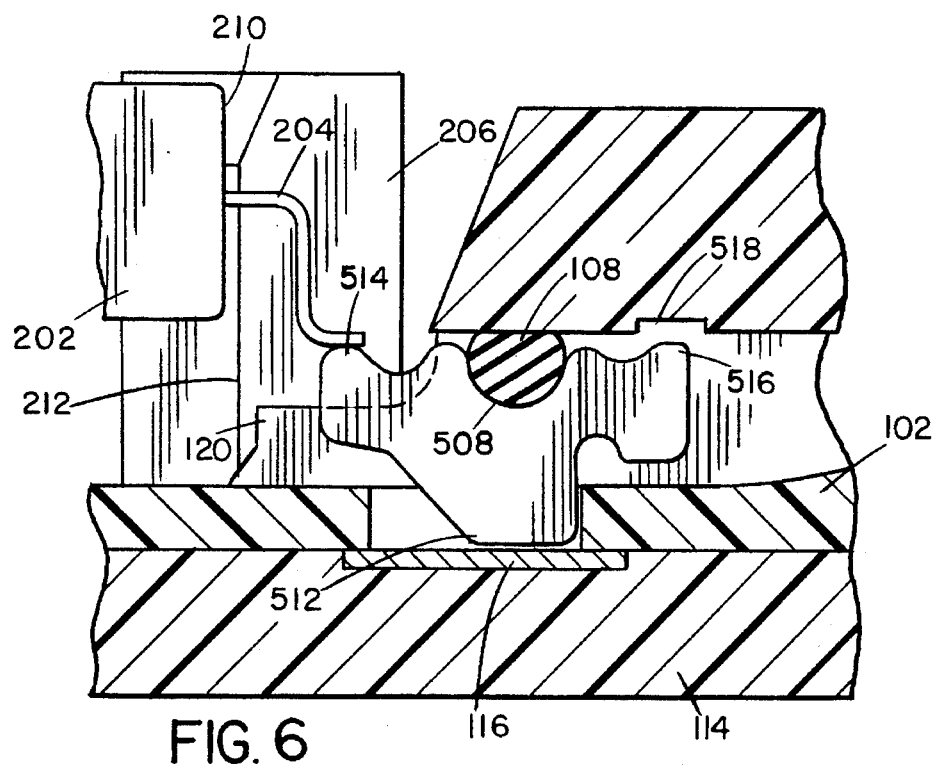
FIG. 6 is a view similar to FIG. 5, with the IC in place but not clamped.

As embodied herein, the manual nest 118 also includes latches 606 for fastening the manual nest 118 to the contactor socket 112. Having latches 606 obviates the need for a hinge in combination with a latch on the manual nest 118. When the manual nest 118 is hinged to the contactor socket 112, it is difficult and time-consuming to attach or remove the manual nest 118, because the hinge must first be assembled or disassembled. To overcome this hinge problem, the manual nest 118 includes the two latches 606. As shown in FIG. 6, the latches 606 are disposed on opposite sides of the handler 602, and the contactor socket 112 includes notches 610 into which the latches 606 fit. Accordingly, to fasten the manual nest 118, the user need only snap the nest 118 over the contactor socket 112, and to detach the manual nest 118, the user need only press the latches 606 to quickly remove the nest 118. As a consequence, the contactor socket 112 can be converted from automated to manual use, and vice-versa, virtually in seconds.

The process for hand testing an electrical device, such as an IC, will now be described. First, as described above, the IC device 202 is inserted into the contactor socket 112, aligning the IC 202 with the guide posts 206. Corners 614 of a bottom extension 612 of the handler 602 are then fitted within the inside corners 212 of the guide posts 206. Next, the manual nest 118 is urged downward (as shown) into the contactor unit 112 until the tines 616 of the latches 606 snap within the notches 610, fastening together the manual nest 118 and the contactor unit 112. Fastened together, the IC leads 204 can be monitored. To detach the manual nest 118 from the contactor unit 112, the latches 606 are simply pressed toward one another, thereby releasing the tines 616 from the notches 610, and the manual nest 118 is pulled out of the contactor unit 112.

As illustrated in FIG. 4, the latches 606 include a member 702 and a spring 704 for urging the member 702 into a closed position. When the manual nest 118 is fastened to the contactor socket 112, the latches 606 are pressed inward toward the center of the manual nest 118, and the nest is inserted into the contactor socket 112. Once fully inserted, the latches 606 are released and engage the notches 610 on the contactor socket 112. To remove the manual nest 118, the latches 606 are again pressed inward, disengaging the notches 610, and the nest is pulled out of the contactor socket. While most spring loaded latches will work in the manual nest 118 of the present invention, latches manufactured and sold by the Yamanichi Electronics are well-suited to this application.

It will be apparent to those skilled in the art that various modifications and variations can be made in the apparatus and method of the present invention without departing form the spirit or scope of the invention. Thus, it is intended that the present invention cover the modifications and variations of this invention, provided they come within the scope of the appended claims and their equivalents.

What is claimed is:

1. A contactor socket for electrically interconnecting a lead of an electrical device to a conductive area on a board, comprising:

a housing having at least one slot;

an elastomeric element disposed transverse said slot; and at least one probe disposed within said at least one slot, said probe engaging said elastomeric element, said probe having a fulcrum for engaging said conductive area on said board and an arm for engaging said lead of said electrical device, said probe pivoting within said slot about said fulcrum as said lead of said electrical device engages said arm, such that said fulcrum rocks on said conductive area of said board with no appreciable, lateral sliding movement by said probe on said conductive area.

2. The contactor socket recited in claim 1 wherein the housing has a plurality of guide posts for aligning the electrical device within the contactor socket.

3. The contactor socket recited in claim 1 wherein the probe includes a groove for seating the elastomeric element.

4. The contactor socket recited in claim 3 wherein the probe has a top and a bottom, the groove being formed in said top and the fulcrum being located on said bottom, whereby when the cover plate is removed from the top of the housing, the elastomeric element can be replaced without removing the probe from the slot in the housing.

5. The contactor socket recited in claim 1, further comprising a cover plate for securing the probe and the elastomeric element in the housing, said cover plate being secured to a top of the housing.

6. The contactor socket recited in claim 5 wherein the cover plate has a plurality of guide posts for aligning the electrical device within the contactor socket.

7. The contactor socket recited in claim 5 wherein the housing and the cover plate are made from a composite material.

8. The contactor socket recited in claim 1 wherein the electrical device is inserted into the contactor socket, the contactor socket further comprising a manual nest for manually testing the electrical device, said manual nest engaging the housing such that lead of the electrical device contacts the probe.

9. The contactor socket recited in claim 8 wherein the manual nest has at least two latching mechanisms for fastening the manual nest to the housing.

10. The contactor socket recited in claim 9 wherein the two latching mechanisms are located on opposing sides of the manual nest and the housing has a notch on each of at least two opposing sides corresponding to the latching mechanisms, said notch being adapted for receiving the latching mechanism.

11. The contactor socket recited in claim 10 wherein each of the two latching mechanisms comprises a latch member, said latch member having a tine and a spring for urging said tine into one of the notches on the housing.

12. The contactor socket recited in claim 8 wherein the manual nest includes an open window for accessing the lead of the electrical device when the manual nest is engaging the housing.

13. The contactor socket recited in claim 1 wherein as the lead of the electrical device engages the arm of the probe, a wiping action occurs across the lead.

14. The contactor socket recited in claim 1 wherein the elastomeric element urges the fulcrum against the conductive area on the board.

15. The contactor socket recited in claim 1 wherein the probe is in a receiving position when the arm of the probe is unengaged by the lead of the electrical device and the probe is in a contact position when the lead of the electrical device engages the arm of the probe; and wherein the elastomeric element contracts to absorb a force exerted by the at least one probe as probe moves from said receiving position to said contact position, and the elastomeric element expands to urge the at least one probe from said contact position to said receiving position as the lead of the electrical device is removed from the arm of the probe.

16. The contactor socket recited in claim 1 wherein the probe is made from an electrically conductive metallic material.

17. The contactor socket recited in claim 16 wherein the electrically conductive metallic material comprises a beryllium-nickel material.

18. The contactor socket recited in claim 17 wherein the beryllium-nickel material is plated with gold and nickel.

19. The contactor socket recited in claim 18 wherein the elastomer has a hardness in the range of 30 Shore A to 90 Shore A.

20. A contactor socket for electrically interconnecting a lead of an electrical device to a conductive area on a board, comprising:

a housing having at least one slot;

an elastomeric element disposed transverse said slot;

at least one probe disposed within said at least one slot, said probe engaging said elastomeric element, said probe having a fulcrum for engaging said conductive area on said board and an arm for engaging said lead of said electrical device, said probe pivoting within said slot about said fulcrum as said lead of said electrical device engages said arm;

said probe having an upper surface with a groove sized to receive and seat the elastomeric element with a portion of the elastomeric element extending from said groove and said upper surface, allowing the elastomeric element to be lifted from the groove;

a cover plate for securing the probe and elastomeric element in the housing, said cover plate being secured to a top of the housing and having a surface that contacts the portion of the elastomeric element extending outwardly from said groove, compressing the elastomeric element into said groove and exerting a resilient biasing of said fulcrum into contact with said conductive area such that said fulcrum rocks on said conductive area of said board with no appreciable, lateral sliding movement by said probe on said conductive area.

21. A contactor socket for electrically interconnecting a lead of an electrical device to a conductive area on a board, comprising:

a housing having at least one slot;

an elastomeric element disposed transverse said slot;

at least one probe disposed within said at least one slot, said probe engaging said elastomeric element, said probe having a fulcrum for engaging said conductive area on said board and an arm for engaging said lead of said electrical device, said probe pivoting within said slot about said fulcrum as said lead of said electrical device engages said arm;

said probe having an upper surface with a groove sized to receive and seat the elastomeric element with a portion of the elastomeric element extending from said groove and said upper surface, allowing the elastomeric element to be lifted from the groove;

a cover plate for securing the probe and elastomeric element in the housing, said cover plate being secured to a top of the housing and having a groove that encloses the portion of the elastomeric element extending beyond the opening, and said elastomeric element biases said fulcrum into contact with said conductive area such that said fulcrum rocks on said conductive area of said board with no appreciable, lateral sliding movement by said probe on said conductive area.

* * * * *